United States Patent [19]

Farmer

[11] Patent Number: 5,025,182

[45] Date of Patent: Jun. 18, 1991

[54] DIGITAL APPARATUS FOR GENERATING GATING SIGNALS IN RESPONSE TO A DATA SIGNAL

[75] Inventor: Charles Farmer, Austin, Tex.

[73] Assignee: Advanced Micro Devices, Inc., Sunnyvale, Calif.

[21] Appl. No.: 576,610

[22] Filed: Aug. 31, 1990

[51] Int. Cl.[5] .......................................... H03K 19/094
[52] U.S. Cl. ..................................... 307/571; 307/360; 307/385; 307/473; 307/451
[58] Field of Search ............... 307/448, 571, 443, 451, 307/475, 579, 585, 360, 473

[56] References Cited

U.S. PATENT DOCUMENTS

| | | | |
|---|---|---|---|
| 4,074,150 | 2/1978 | Buckley, III et al. | 307/443 |
| 4,408,135 | 10/1983 | Yuyama et al. | 307/585 |
| 4,567,385 | 1/1986 | Falater et al. | 307/451 |
| 4,682,054 | 7/1987 | McLaughlin | 307/443 |
| 4,916,337 | 4/1990 | Leung et al. | 307/475 |

FOREIGN PATENT DOCUMENTS 0075618  4/1986  Japan .................................. 307/473

Primary Examiner—David Hudspeth
Assistant Examiner—Scott A. Ouellette
Attorney, Agent, or Firm—Foley & Lardner

[57] ABSTRACT

An apparatus for generating first and second digital gating signals in response to a data signal. The first gating signal and the second gating signal are selectively isolatable from each other according to a state signal. The apparatus comprises a gate signal circuit for receiving the data signal and generating the first gating signal on a first line and the second gating signal on a second line. A state input circuit receives the state signal and distributes a plurality of control signals representative of the state signal to the apparatus. An override circuit imposes values on the first and second lines in response to the control signals. The override circuit electrically isolates the first line from the second line in response to the control signals. In a preferred embodiment, the apparatus also includes a DRIVE-HIGH circuit for controlling the override circuit. The DRIVE-HIGH circuit is configured to operate when the state signal is in a first state to detect when a drive signal goes high, and responds to the driver signal going high by gating the override circuit appropriately to effect electrical disconnection of the first line and the second line. The DRIVE-HIGH circuit maintains such electrical isolation between the first line and the second line until the state signal changes to a second state.

4 Claims, 3 Drawing Sheets

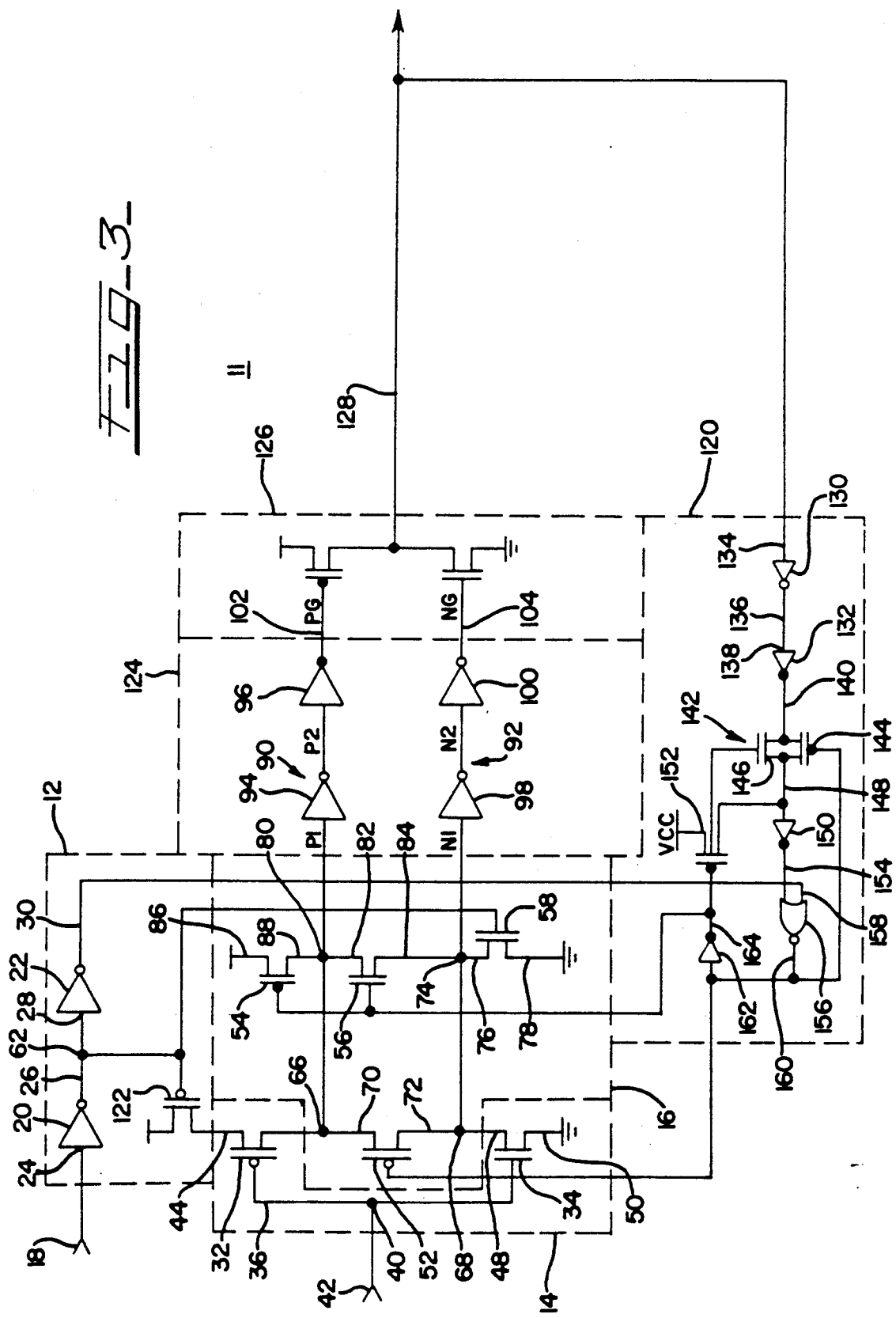

DIGITAL APPARATUS FOR GENERATING GATING SIGNALS IN RESPONSE TO A DATA SIGNAL

CROSS REFERENCE TO RELATED APPLICATIONS

The following applications contain subject matter similar to the subject matter of this application.

(TT0081) U.S. patent application Ser. No. 576060, filed 8/31/90; entitled "Apparatus for Generating Digital Gating Signals in Response to a Digital Data Signal"; and (TT0083) U.S. patent application Ser. No. 576006, filed 8/31/90; entitled "An Apparatus for Controlling Digital Driver Signals to Accommodate a Host System".

BACKGROUND OF THE INVENTION

The present invention is directed to an apparatus for generating digital gating signals in response to a data signal. Specifically, the present invention is directed to a three-state apparatus for generating digital gating signals which is capable of generating a high signal, a low signal, and a HIGH-Z (OFF) signal.

According to generally accepted industry standards, high signals may be generated as a "0" on both N-channel and P-channel drive lines from a buffer driver to a buffer to result in a "1" signal at the driver output; a low signal at a buffer output is represented by a "1" signal at both the P-channel and N-channel drive lines from a buffer driver to a buffer to result in a "0" signal at a buffer output. A HIGH-Z signal (OFF) is represented by a "1" signal on a P-channel drive line from a buffer driver and a simultaneous "0" signal on an N-channel drive line from a buffer driver. Accordingly, it is necessary, in order to generate the accepted definition of a HIGH-Z (OFF) signal to isolate the N-channel and P-channel drive lines from a buffer driver. The present invention provides an apparatus configured to enable such isolation of N-channel and P-channel drive lines appropriate for providing a HIGH-Z (OFF) signal in response to an ENABLE signal. The present invention will isolate the N-channel and P-channel drive line outputs appropriately to define a HIGH-Z (OFF) signal when the ENABLE signal is in a first state and will electrically connect the N-channel and P-channel output drive lines when the ENABLE signal is in a second state.

A further improvement associated with the present invention is a DRIVE-HIGH feature which provides for a feedback sensing of the data signal output of a buffer driven by the apparatus of the present invention to sense when that driver signal goes high. When the driver signal goes high, the DRIVE-HIGH feature responds to the driver signal by electrically disconnecting the drive signal output lines and maintaining that electrical isolation until the state signal changes to a second state, regardless of any variance of the data signal received by the apparatus. Such a momentary DRIVE-HIGH feature provides for rapid response of the apparatus of the present invention when the apparatus is going to a HIGH-Z (OFF) configuration without requiring the P-channel drive signal line to ramp up (relatively slowly) to its positive value as required by the HIGH-Z (OFF) signal definition. Such relatively slow ramping up is inherent by the RC time circuit established by effective high capacitance of a driver circuit and associated resistances inherent within the driver circuit.

SUMMARY OF THE INVENTION

The invention is an apparatus for generating digital gating signals in response to a data signal. The digital gating signals comprise a first gating signal and a second gating signal; the first gating signal and the second gating signal are selectively isolatable from each other according to a state signal.

The apparatus comprises a gate signal circuit for receiving the data signal and generating the first and second gating signals. The first gating signal is presented on a first line and the second gating signal is presented on a second line. The apparatus also includes a state input circuit for receiving the state signal and distributing a plurality of control signals to the apparatus, each of which plurality of control signals is representative of the state signal; and an override circuit for imposing values on the first and second line, which imposing is effected in response to the control signals. The override circuit electrically isolates the first line from the second line in response to the control signals.

In a preferred embodiment of the present invention, the apparatus also includes a DRIVE-HIGH circuit for controlling the override circuit. The DRIVE-HIGH circuit is configured to operate when the state signal is in a first state to detect when the driver signal from an associated driven buffer goes high. The DRIVE-HIGH circuit responds to the driver signal going high by gating the override circuit appropriately to effect electrical disconnection of the first line and the second line and the DRIVE-HIGH circuit maintains such electrical isolation between the first line and the second line until the state signal changes to a second state.

It is, therefore, an object of the present invention to provide an apparatus for generating digital gating signals in response to a data signal which will selectively impose values on digital gating signal data lines in response to a state signal.

A further objective of the present invention is to provide an apparatus for generating digital gating signals in response to a data signal which will respond to a drive signal from a buffer driven by the apparatus to electrically disconnect the two data signal drive lines and maintain such electrical isolation until the state signal changes state.

Further objects and features of the present invention will be apparent from the following specification and claims when considered in connection with the accompanying drawings illustrating the preferred embodiment of the invention.

DETAILED DESCRIPTION OF THE DRAWINGS

FIG. 3 is an electrical schematic diagram of the preferred embodiment of the present invention including the DRIVE-HIGH feature of the present invention.

DETAILED DESCRIPTION OF THE INVENTION

Figure 1:
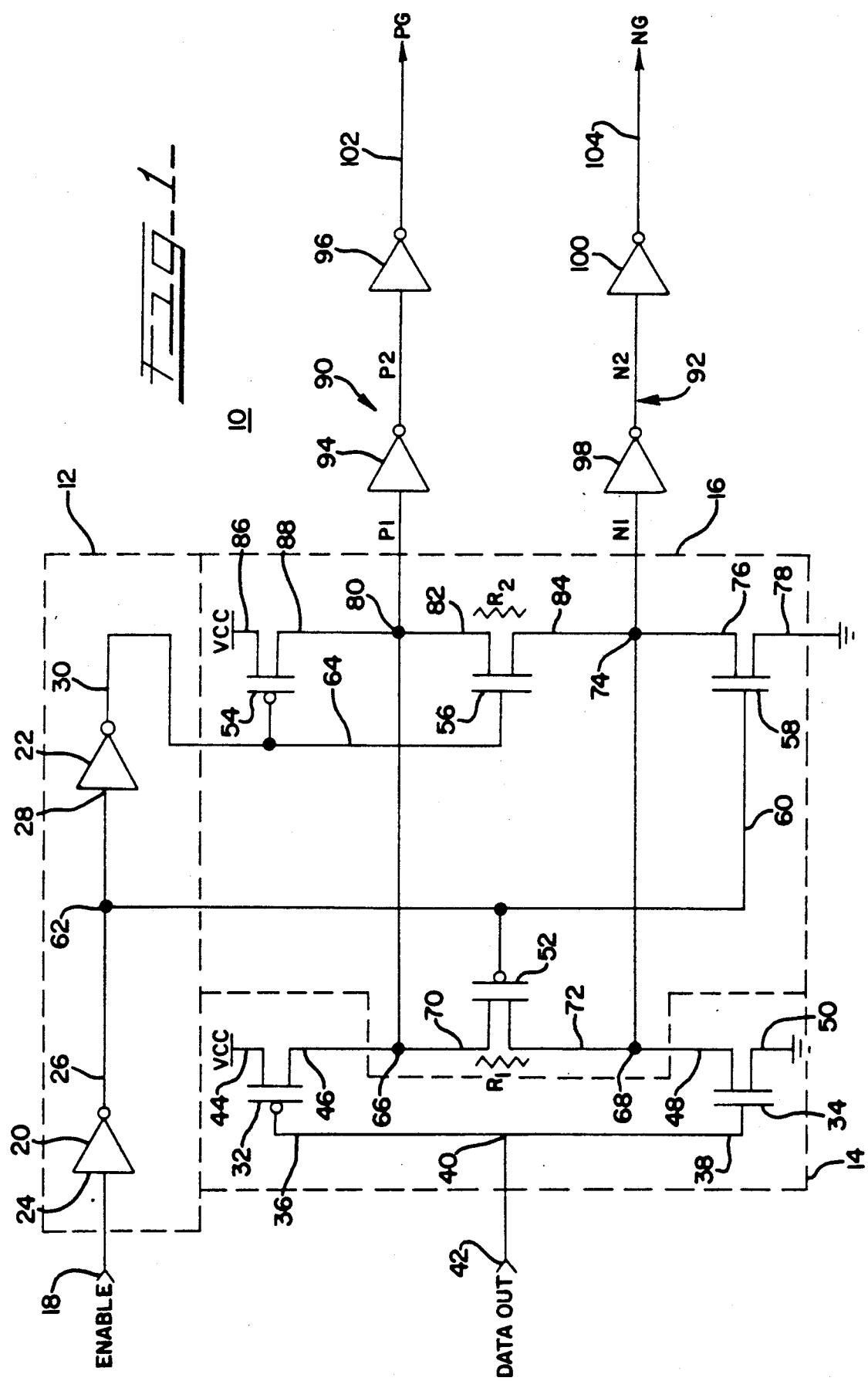
FIG. 1 is an electrical schematic diagram of a CMOS implementation of a first embodiment of the present invention.

In FIG. 1, an apparatus 10 is illustrated comprising a state input circuit 12, a gate signal circuit 14, and an override circuit 16. State input circuit 12 receives a state signal (an ENABLE signal) at pin 18. State input circuit 12 is comprised of a pair of inverters 20, 22 serially connected so that the ENABLE signal is applied to input 24 of inverter 20, and output 26 of inverter 20 is applied to input 28 of inverter 22. Inverter 22 produces an output at 30.

Gate signal circuit 14 is comprised of a P-channel field effect transistor (FET) 32 and an N-channel FET 34. Gate 36 of P-channel FET 32 and gate 38 of N-channel FET 34 are commonly connected at juncture 40. Juncture 40 is electrically connected with input pin 42 which receives a data signal DATA OUT, such as an output signal from a computing device, or the like. P-channel FET 32 is connected to gate a reference voltage VCC from its pole 44 to its pole 46 in response to signals applied at gate 36. N-channel FET 34 is connected to gate signals appearing at its pole 48 to ground through its pole 50 in response to signals applied to gate 38.

Override circuit 16 is comprised of P-channel FET 52, P-channel FET 54, N-channel FET 56, and N-channel FET 58. P-channel FET 52 and N-channel FET 58 are gated by a signal carried on line 60 from juncture 62 intermediate inverters 20, 22. Thus, P-channel FET 52 and N-channel FET 58 are gated by a signal which is the inverse of ENABLE. P-channel FET 54 and N-channel FET 56 are gated by a signal received from output 30 of inverter 22 on line 64. Thus, P-channel FET 54 and N-channel FET 56 are gated by a signal which is substantially synchronous with ENABLE. P-channel FET 52 is connected to gatingly connect juncture 66 with juncture 68 across its poles 70, 72 in response to the inverse of ENABLE appearing on line 60. N-channel FET 58 is connected to gatingly connect juncture 74 with ground across its poles 76, 78 in response to the inverse of ENABLE appearing on line 60. N-channel FET 56 is connected to gate juncture 80 with juncture 74 across its poles 82, 84 in response to gating signals appearing on line 64. P-channel FET 54 is connected to gate reference voltage VCC with juncture 80 across its poles 86, 88 in response to gating signals appearing on line 64.

P-channel gating signal drive line 90 is electrically connected with junctures 66, 80 and contains serially connected inverters 94, 96. N-channel gating signal drive line 92 is electrically connected with junctures 68, 74 and contains serially connected inverters 98, 100. The output 102 of inverter 96 carries P-channel gating signal PG, and output 104 of inverter 100 carries N-channel gating signal NG.

When ENABLE is a "1", or high, the gating signal appearing on line 60 and applied to P-channel FET 52 and N-channel FET 58 is a "0", or low. Accordingly, P-channel FET 52 is gated-on and N-channel FET 58 is gated-off. Further, the gating signal appearing at line 64 is a "1", which results in P-channel FET 54 being gated-off and N-channel FET 56 being gated-on. In such configuration, P-channel FET 54 and N-channel FET 58 are effectively excluded from affecting operations of apparatus 10, and P-channel gating signal drive line 90 is electrically connected with N-channel gating signal drive line 92. Inherent resistance $R_1$ in P-channel FET 52 and inherent resistance $R_2$ in N-channel FET 56 contribute resistance to an RC time circuit established by those resistances $R_1$, $R_2$ and the input capacitances of inverters 94, 98.

In the embodiment of FIG. 1, inverter 94 has a low threshold voltage setting and inverter 98 has a high threshold voltage setting.

P-channel gating signal drive line 90 carries signal P1 intermediate juncture 66 and inverter 94, and carries signal P2 intermediate inverter 94, 96. N-channel gating signal drive line 92 carries signal N1 intermediate juncture 68 and inverter 98, and carries signal N2 intermediate inverters 98, 100.

Figure 2:
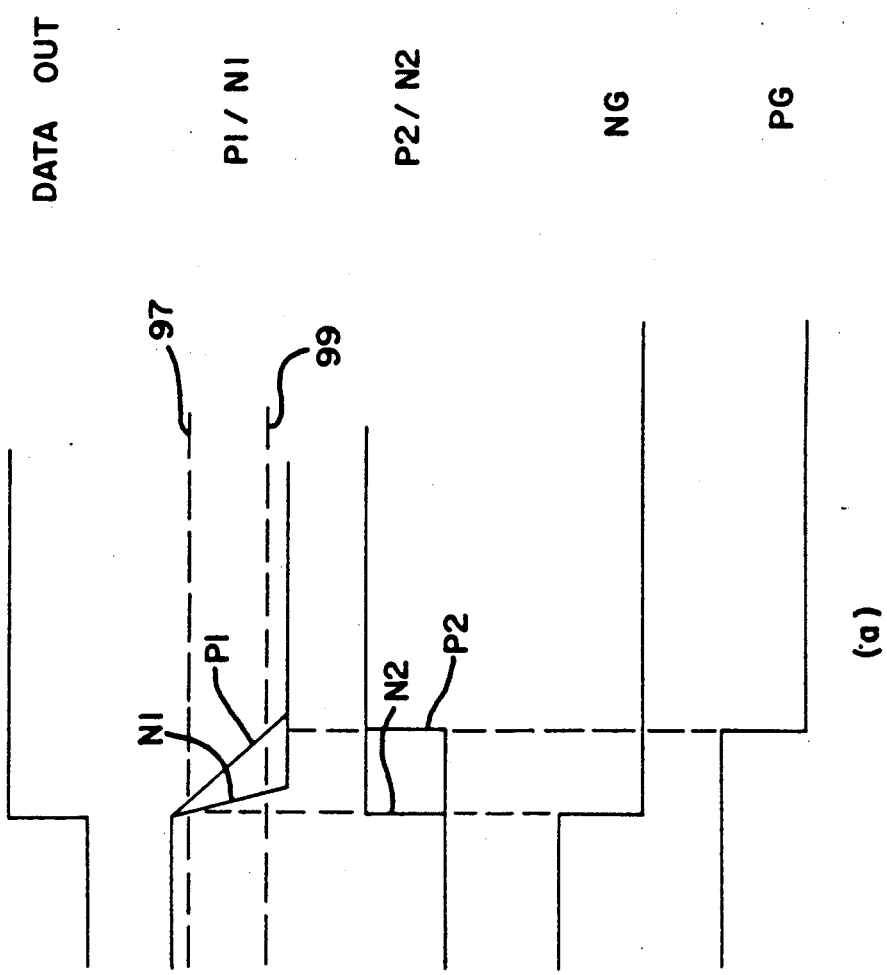
FIG. 2(a-b) is a schematic illustration of selected wave forms at various locations within the invention.

FIG. 2 is a schematic illustration of selected wave forms at various locations within apparatus 10. In FIG. 2(a), the effect of a transition of DATA OUT from low to high when ENABLE is a "1" is illustrated. When DATA OUT is low, P-channel FET 32 is gated-on, thus operatively connecting VCC from pole 44 through pole 46 to juncture 66, and to juncture 68 through the resistive array $R_1$, $R_2$. N-channel FET 34 is gated-off, isolating junctures 66, 68 from ground. Thus, when DATA OUT is low, signals P1, N1 are high. Consequently, signals P2, N2 are low and signals NG, PG are high.

When DATA OUT changes from low to high, the inherent capacitance of the inputs of inverters 94, 98 combine with the resistance of resistive array $R_1$, $R_2$ to create an RC time circuit which causes a ramping down of signals N1, P1, as illustrated in FIG. 2(a). As signal N1 crosses the high threshold 97 established for inverter 98, signal N2 transitions from low to high, which transition is substantially instantaneous since no significant resistance is associated in the circuit with respect to inverters 96 or 100. Similarly, as signal P1 passes the lower threshold 99 associated with inverter 94, signal P2 transitions from low to high. Thus, by selecting appropriately displaced thresholds 97, 99 for inverters 98, 94, the transition of signal N2 from low to high is time-displaced from the transition of signal P2 from low to high. Consequently, signal NG is time-displaced from signal PG.

A similar, mirror-image sequence occurs when DATA OUT transitions from high to low, as illustrated in FIG. 2(b). Thus, when DATA OUT is high, P-channel FET 32 is gated-off and N-channel 34 is gated-on, thereby operatively connecting both junctures 66 and 68 to ground through poles 48, 50. When DATA OUT is high, signals P1, N1 are low. When DATA OUT transitions from high to low, the RC time circuit established by resistive array $R_1$, $R_2$ and the input capacitances of inverters 94, 98 causes a ramping up of signals N1, P1. As signal P1 exceeds the low threshold 99 established in connection with inverter 94, signal P2 transitions from high to low. Similarly, as signal N1 exceeds the high threshold 97 associated with inverter 98, signal N2 transitions from high to low. In such manner, there is an assured time displacement between transitions from low to high of signals PG, NG.

When ENABLE is a "0", the gating signal appearing on line 60 is "1" and the gating signal at line 64 is "0". Accordingly, P-channel FET 52 is gated-off and N-channel FET 58 is gated-on. Further, P-channel FET 54 is gated-on and N-channel FET 56 is gated-off. Thus, with the state signal ENABLE at "0", P-channel gating signal drive line 90 is electrically isolated from N-channel gating signal drive line 92, and reference voltage VCC is gated to juncture 80 through poles 86, 88, thereby imposing a high signal on P-channel gating signal drive line 90. Further, juncture 74 is connected to ground through poles 76, 78, thereby imposing a low signal on N-channel gating signal drive line 92. This configuration, signal PG high and signal NG low, is the industry standard for a HIGH-Z (OFF) signal for a three-state buffer circuit, and a circuit (not shown) responding to apparatus 10 would recognize this imposed configuration to appropriately indicate a third, HIGH-Z (OFF) state.

In order to facilitate understanding of the present invention, like elements will be identified by like reference numerals in the various drawings.

FIG. 3 is an electrical schematic diagram of the preferred embodiment of the present invention including the DRIVE-HIGH feature of the present invention. In FIG. 3, an apparatus 11 is illustrated comprising a state input circuit 12, a gate signal circuit 14, an override circuit 16, and a DRIVE-HIGH circuit 120.

State input circuit 12 is comprised of inverters 20, 22 and P-channel FET 122.

Gate signal circuit 14 is comprised of P-channel FET 32 and N-channel FET 34. Override circuit 16 is comprised of P-channel FET 52, P-channel FET 54, N-channel FET 56, and N-channel FET 58. Further included in apparatus 11 is output section 124 comprising inverters 94, 96 associated with P-channel gating signal drive line 90 and inverters 98, 100 associated with N-channel gating signal drive line 92. Output section 124 provides P-channel gating signal PG and N-channel gating signal NG to a buffer 126, and buffer 126 provides a driver signal output at 128.

DRIVE-HIGH circuit 120 is comprised of inverters 130, 132 which are series-connected to receive the driver signal from output 128 of buffer 126 at input 134 of inverter 130. Output 136 of inverter 130 is applied at input 138 of inverter 132. Output 140 of inverter 132 is applied to switch 142 which is comprised of P-channel FET 144 and N-channel FET 146. Switch 142 has an output 148 which is applied to the input of an inverter 150 as well as to a P-channel FET 152. The output 154 of inverter 150 is provided as one input to a NOR gate 156. A second input to NOR gate 156 is provided at input 158 from output 30 of inverter 22. Output 160 of NOR gate 156 gates P-channel FET 144 and gates P-channel FET 52 and, further, is applied to the input of inverter 162. The output 164 of inverter 162 gates P-channel FET 152, gates N-channel FET 56, gates P-channel FET 54, and gates N-channel FET 142.

In operation, if the ENABLE signal applied at input pin 18 to state input circuit 12 is "0", then output 30 from inverter 22 is also "0", output 160 from NOR gate 156 remains at "0", and output 164 from inverter 162 remains at "1" until it is determined that a driver signal output at 128 is a "1". When a driver signal output at 128 is a "1", then output 164 of inverter 162 goes to "0", output 160 of NOR gate 156 is a "1", and switch 142 is turned off, thereby ensuring that further changes in value of signals arriving at input 134 of inverter 130 (i.e., signals appearing at driver signal output 128) have no further effect until the ENABLE signal applied at pin 18 returns to "1".

When output 164 of inverter 162 is "0", as previously stated, switch 142 is off and P-channel FET 152 is gated-on, thereby applying reference voltage VCC to the input of inverter 150. In such situation, output 154 of inverter 150 is a "0", which keeps output 160 of NOR gate 156 and output 164 of inverter 162 at appropriate values to maintain switch 142 in an off state. This situation is maintained until the ENABLE signal applied at pin 18 goes to a "1" value.

When the ENABLE signal goes to a "1" value, then output 164 of inverter 162 goes to a "1", gating-off P-channel FET 152, gating-on N-channel FET 146, and gating-on P-channel FET 144. In such a configuration, signals appearing at driver signal output 128 now are allowed to pass through inverters 130, 132, and switch 142 to appear at output 154 of inverter 150 and be applied as an input to NOR gate 156. Thus, so long as the ENABLE signal is a "1" value, output 164 of inverter 162 is a "1" value and output 160 of NOR gate 156 is a "0" value. The situation does not change until the ENABLE signal goes to a "0" value and isolates the driver signal output 128 from NOR gate 156, as previously described.

Since output 160 of NOR gate 156 gates P-channel channel FET 52, and since output 164 of inverter 162 gates P-channel FET 54 and N-channel FET 56, when the ENABLE signal is a "1", then a "1" value will always be applied to gate-off P-channel FET 54 and to gate-on N-channel FET 56. Similarly, whenever the ENABLE signal is a "1" value, there will always be a "0" signal to gate-on P-channel FET 52. As a result, whenever the ENABLE signal is a "1" value, apparatus 11 of FIG. 3 will effectively operate in the same manner as apparatus 10 of FIG. 1.

However, if the ENABLE signal is a "0" value, then DRIVE-HIGH circuit 120 responds to a high driver signal output at 128 as previously described to immediately lock output 164 of inverter 162 to a "0" value, thereby gating-off N-channel FET 56, locking output 160 of NOR gate 156 to a "1" value, and gating-off P-channel FET 52. The result is that P-channel gating signal drive line 90 is thereby electrically isolated from N-channel gating signal drive line 92. At the same time, P-channel FET 54 is gated-on, driving signal PG high, and N-channel FET 58 is gated-on, driving signal NG low. Thus, response of apparatus 11 in going to a HIGH-Z (OFF) configuration is delayed until driver signal output 128 goes high.

It is to be understood that, while the detailed drawings and specific examples given describe preferred embodiments of the invention, they are for the purpose of illustration only, that the apparatus of the invention is not limited to the precise details and conditions disclosed and that various changes may be made therein without departing from the spirit of the invention which is defined by the following claims:

I claim:

1. A digital apparatus for generating digital gating signals in response to a data signal, said digital gating signals comprising a first gating signal and a second gating signal, said first gating signal and said second gating signal being selectively isolatable from each other according to a state signal; the apparatus comprising:

a gate signal means for receiving said data signal and generating said first and second gating signals, said first gating signal being presented on a first line, said second gating signal being presented on a second line;

a state input means for receiving said state signal and distributing a plurality of control signals to the apparatus, each of said plurality of control signals being representative of said state signal; and an override means for imposing values on said first line and said second line, said imposing being effected in response to said control signals, said override means electrically isolating said first line and said second line in response to said control signals.

2. An apparatus for generating digital gating signals in response to a data signal as recited in claim 1 wherein said gate signal means comprises a first and a second digital switching means for switching digital signals;

said first and said second digital switching means commonly receiving said data signal at their respective gates; said first digital switching means being operatively connected as pull-up digital switch between a voltage source and said first line; said second digital switching means being operatively connected as a pulldown down digital switch between ground and said second line.

3. An apparatus for generating digital gating signals in response to a data signal as recited in claim 2 wherein said state input means comprises a first inverter; a second inverter; and first and second override switching means for effecting said imposing and said isolating; said first inverter receiving said state signal and generating a first inverter output, said second inverter receiving said first inverter output and generating a second inverter output; said first inverter output comprising a first control signal of said plurality of control signals, said second inverter output comprising a second control signal of said plurality of control signals; said first override switching means responding to said first control signal and said second override switching means responding to said second control signal to electrically isolate said first line from said second line, to impose a high signal on said first line, and to impose a low signal on said second line when said state signal is in a first state; said first override switching means responding to said first control signal and said second override switching means responding to said second control signal to electrically connect said first line and said second line when said state signal is in a second state.

4. An apparatus for generating digital gating signals in response to a data signal as recited in claim 3 wherein said first and second gating signals are provided to a driver circuit, said driver circuit generating a driver signal in response to said first and second gating signals, and wherein said state means comprises a drive-high means for controlling said override means, said drive-high means being configured to operate when said state signal is in a first state to detect when said driver signal goes high, said drive-high means responding to said driver signal going high by gating said override means appropriately to effect electrical connection of said first line and said second line, said drive-high means maintaining said electrical connection until said state signal changes to a second state.

* * * * *